United States Patent
Wiesend et al.

(10) Patent No.: US 11,476,640 B2
(45) Date of Patent: Oct. 18, 2022

(54) ADAPTER ELEMENT FOR CONNECTING A COMPONENT, SUCH AS A LASER DIODE, TO A HEAT SINK, A SYSTEM COMPRISING A LASER DIODE, A HEAT SINK AND AN ADAPTER ELEMENT AND METHOD FOR PRODUCING AN ADAPTER ELEMENT

(71) Applicant: Rogers Germany GmbH, Eschenbach (DE)

(72) Inventors: Johannes Wiesend, Speinshart (DE); Heiko Schweiger, Oberbibrach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 308 days.

(21) Appl. No.: 16/645,714

(22) PCT Filed: Sep. 7, 2018

(86) PCT No.: PCT/EP2018/074207
§ 371 (c)(1),
(2) Date: Mar. 9, 2020

(87) PCT Pub. No.: WO2019/052924
PCT Pub. Date: Mar. 21, 2019

(65) Prior Publication Data
US 2020/0280168 A1    Sep. 3, 2020

(30) Foreign Application Priority Data
Sep. 12, 2017   (DE) .................. 102017121015.6

(51) Int. Cl.
*H01S 5/024*      (2006.01)
*H01L 23/367*    (2006.01)
*H01L 23/373*    (2006.01)

(52) U.S. Cl.
CPC ...... *H01S 5/02469* (2013.01); *H01L 23/3672* (2013.01); *H01L 23/3735* (2013.01); *H01S 5/02492* (2013.01)

(58) Field of Classification Search
None
See application file for complete search history.

(56) References Cited

U.S. PATENT DOCUMENTS

| 5,465,898 A    | 11/1995 | Schulz-Harder et al. |
| 8,340,144 B1 * | 12/2012 | Grove ................ H01S 5/02365 372/36 |

(Continued)

FOREIGN PATENT DOCUMENTS

| DE | 19821544 A1   | 12/1999 |
| DE | 102005061049 A1 | 6/2007 |

(Continued)

OTHER PUBLICATIONS

IPRP Report dated Mar. 12, 2020 for International Application No. PCT/EP2018/074207; International Filing Date: Sep. 7, 2018, 7 pages.

*Primary Examiner* — Tuan N Nguyen
(74) *Attorney, Agent, or Firm* — Cantor Colburn LLP

(57) ABSTRACT

An adapter element (10) for connecting a component (4), such as a laser diode, to a heat sink (7), comprising: a first metal layer (11), which in a mounted state faces the component (4), and a second metal layer (12), which in the mounted state faces the heat sink (7), and an intermediate layer (13) comprising ceramic arranged between the first metal layer (11) and the second metal layer (12), wherein the first metal layer (11) and/or the second metal layer (12) is thicker than 40 μm, preferably thicker than 70 μm and more preferably thicker than 100 μm.

14 Claims, 4 Drawing Sheets

(56) References Cited

U.S. PATENT DOCUMENTS

| | | |
|---|---|---|
| 2003/0104678 A1 | 6/2003 | Kelly et al. |
| 2003/0211708 A1* | 11/2003 | Acklin ................ H01L 21/4875 |
| | | 438/460 |
| 2012/0161190 A1 | 6/2012 | Yao |
| 2015/0108518 A1 | 4/2015 | Samonji et al. |
| 2015/0221579 A1 | 8/2015 | Iwata et al. |

FOREIGN PATENT DOCUMENTS

| | | |
|---|---|---|
| DE | 102006009159 A1 | 8/2007 |
| DE | 102016218522 B3 | 6/2017 |
| JP | 2010283169 A | 12/2010 |
| JP | 2015072957 A | 4/2015 |
| JP | 2016207841 A | 12/2016 |
| WO | 2014014054 A1 | 1/2014 |

* cited by examiner

ADAPTER ELEMENT FOR CONNECTING A COMPONENT, SUCH AS A LASER DIODE, TO A HEAT SINK, A SYSTEM COMPRISING A LASER DIODE, A HEAT SINK AND AN ADAPTER ELEMENT AND METHOD FOR PRODUCING AN ADAPTER ELEMENT

CROSS-REFERENCE TO RELATED APPLICATIONS

This application is a National Stage application of PCT/EP2018/074207, filed Sep. 7, 2018, which claims the benefit of German Application No. 10 2017 121 015.6, filed Sep. 12, 2017, both of which are incorporated by reference in their entirety herein.

BACKGROUND

The present invention concerns adapter elements for connecting a component, such as a laser diode, to a heat sink, a system comprising of a laser diode, a heat sink and an adapter element, and a method for manufacturing an adapter element.

For cooling electrical components that generate heat during operation, such as laser diodes, the state of the art knows heat sinks that are connected to the laser diode via an adapter element. An example of this can be found in JP 2004 186 527 A. The adapter elements arranged between the laser diode and the heat sink are usually used to adapt different coefficients of expansion of the materials, from which the heat sinks and the electrical components such as an OP-amplifier, coils or a laser diode are made. The reason for this is that otherwise the different expansion coefficients can lead to thermomechanically induced stresses in the connection area during operation. As a result of these thermomechanical stresses, the laser diode may be deformed, which, in turn, may lead to a change in the emission wavelength of the laser diode, or even cracking.

To establish the connection between the heat sink and the laser diode, the laser diode is therefore joined to the heat sink via the adapter element, especially soldered using AuSn solder material. For this purpose, the adapter elements must be coated with the AuSn solder material, typically using a sputtering process.

SUMMARY

Based on this background, the present invention makes it its task to provide adapter elements which can withstand high temperature loads during operation, which allow an optimal adaptation of the expansion coefficients in the system comprising a component such as laser diode, adapter element and which heat sink and can be manufactured comparatively easily and quickly.

This problem is solved by an adapter element according to claim 1, a cooling device with a heat sink and an adapter element according to claim 7, and by a method for manufacturing an adapter element according to claim 8. Further advantages and features of the invention result from the dependent claims as well as the description and the attached figures.

In accordance with the invention, an adapter element is provided for connecting a component such as a laser diode to a heat sink, comprising a first metal layer, which in a mounted state faces the component, and a second metal layer, which in the mounted state faces the heat sink, and an intermediate layer comprising ceramic arranged between the first metal layer and the second metal layer, wherein the first metal layer and/or the second metal layer is thicker than 40 μm, preferably thicker than 70 μm and particularly preferably thicker than 100 μm.

Further advantages and features result from the following description of preferred embodiments of the subject matter of the invention with reference to the attached figures. Individual features of the individual embodiments can be combined within the scope of the invention.

DETAILED DESCRIPTION OF THE INVENTION

Figure 1:
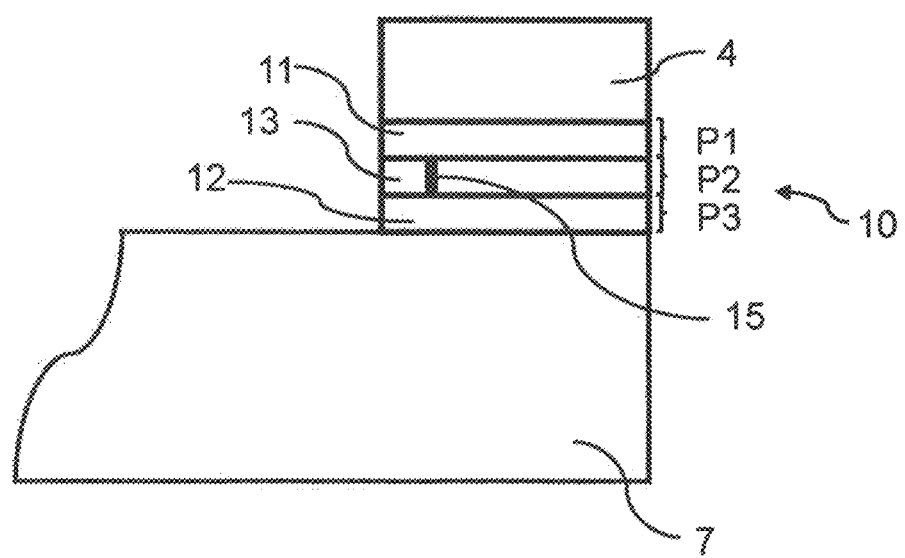
FIG. 1 shows a mounted adapter element according to a first preferred embodiment of the present invention.

Compared to the state of the art, the invention provides a comparatively thick first and/or second metal layer, the thickness of which has the advantage of supporting thermal expansion during heat transport through the adapter element. This heat spread, in turn, leads to the most homogeneous heat distribution in an interface area between the heat sink and the adapter element. In this way, thermomechanical stresses caused by different thermal expansion coefficients of the individual components can be counteracted with advantage. This means that an adapter element can be provided, with which a voltage-reduced interface between adapter element and heat sink can be realized in the mounted state, whereby cracking in the system comprising e.g. laser diode, adapter element and heat sink or deformation of the laser diode, e.g. changing the wavelength, can be suppressed in an advantageous way. In addition, the claimed thickness of the first metal layer and/or the second metal layer can be realized in an advantageous way simply and quickly by means of a DCB process or an active soldering process. In addition, the use of an intermediate layer comprising ceramic allows the coefficients of thermal expansion to be adjusted, which further counteracts the development of thermo-mechanical stresses during operation.

Preferably, the first metal layer and/or the second metal layer comprise copper, in particular with a purity of 99.98% or higher. Furthermore, it is provided that the intermediate layer comprises $Al_2O_3$, $Si_3N_4$, or an HPSX ceramic (i.e., a ceramic having an $Al_2O_3$ matrix comprising an x-percent $ZrO_2$ content, for example $Al_2O_3$ having 9% $ZrO_2$=HPS9 or $Al_2O_3$ with 25% $ZrO_2$=HPS25). It is particularly preferred that it is a ceramic comprising AlN, especially with a thermal conductivity of more than 150 W/mK, preferably more than 175 W/mK and especially preferably more than 225 W/mK. This has the advantage of further improving the adaptation to the expansion coefficients.

According to a further embodiment of the present invention, it is provided that the intermediate layer for adapting the coefficients of expansion is thinner than 400 μm, preferably thinner than 200 μm and particularly preferably thinner than 100 µm. In particular, it is provided that the intermediate layer should have a secondary thickness configured to adjust the coefficients of expansion as optimally as possible. This further supports the suppression of thermo-mechanical stresses. Preferably, a ratio between a cumulative thickness of a primary layer thickness of the first metal layer and a primary layer thickness of the second metal layer to the secondary layer thickness of the intermediate layer has a value between 0.7 and 2, preferably between 0.8 and 1.5 and more preferably between 0.95 and 1.2.

Preferably, the secondary layer has a thickness between 0.05 mm and 0.5 mm, preferably between 0.1 mm and 0.4 mm, and more preferably between 0.2 and 0.38 mm. Furthermore, values between 0.01 mm and 0.15 mm, preferably between 0.02 and 0.13 mm and more preferably between 0.025 and 0.11 mm are conceivable as the primary layer thickness of the respective first metal layer or the second metal layer. In particular, a ratio of the cumulative primary layer thickness of the first and second metal layers to the secondary layer thickness of the intermediate layer has a value between 0.2 and 0.8, preferably between 0.25 and 0.65 and more preferably between 0.3 and 0.55. Preferably, it is provided that the adapter element is formed at least 20% by the first metal layer and the second metal layer.

In a further embodiment of the present invention, it is provided that several adapter elements are provided in an arrangement, the adapter elements being separable from the carrier by a predetermined breaking point. This allows a common handling of several adapter elements with advantage. This means that the individual adapter elements do not have to be transported individually or prepared for the connection of the laser diodes. For example, the several adapter elements can be coated together, which simplifies the production of the individual adapter elements with advantage. Preferably, the adapter elements are arranged next to each other on a common carrier and the adjacent adapter elements are separated from each other by corresponding predetermined breaking points.

It is preferably provided that the adapter element or the adapter elements have an electrically conductive contact, especially to a carrier of the arrangement. The connection via an electrical contact proves to be particularly advantageous because the adapter element can be kept at a desired potential for a sputter process by means of the electrical contact. In other words, the integration of the electrical contact has the advantage that individual contacting can be dispensed in case of a necessary coating of the adapter elements, especially with a solder material. This further simplifies the connection of the laser diode to the heat sink.

It is particularly preferred that the first metal layer and/or the second metal layer have a thickness between 75 µm and 120 µm.

It is preferably provided that the electrically conductive contact is configured in such a way that it breaks off when the predetermined breaking point is broken. In particular, the electrically conductive contact is configured such thin that it breaks off when a force is applied along the predetermined breaking point, which is necessary to break off the adapter element. It is also conceivable that the electrically conductive contact is perforated or has a local material thinning. By configuring the electrically conductive contact accordingly, it is advantageously possible to dispense an additional work step in which the electrically conductive contact must be removed.

According to a further embodiment of the present invention, it is provided that the intermediate layer has or can have an electrically conductive through hole, i.e. a via. By means of a through-hole through the otherwise insulating intermediate layer, it is advantageously possible to use the adapter element also for applications, for which an electrically conductive connection between the laser diode and the heat sink is provided. Alternatively, it is conceivable that the intermediate layer could be configured as an insulating layer for applications, for which no electrical connection between the laser diode and the heat sink is provided.

A further object of the present invention concerns an arrangement of several adapter elements according to the invention, the adapter elements being arranged on a common carrier so as to be separable by means of a predetermined breaking point. All features described for the adapter element according to the invention and their advantages can also be transferred to the arrangement according to the invention and vice versa. In particular, a common intermediate layer, preferably a ceramic intermediate layer, extends in the arrangement both along the carrier and the adapter element, i.e. the adapter elements and the carrier are arranged next to each other in a plane parallel to a main plane of extension (along which the intermediate layer extends). Preferably the first metal layer, the intermediate layer and the second metal layer form the carrier and the adapter elements. The subdivision between carrier and adapter element is realized by a structuring in the first metal layer and the second metal layer. The structuring also reveals the visible separation between the individual adapter elements arranged next to each other along a row. In particular, the predetermined breaking point is realized in the ceramic layer, especially in an area without first and/or second metal layer. Preferably, the predetermined breaking point runs both between the individual adapter elements arranged in a row next to each other and between the carrier and the adapter elements arranged in a row. For separation, i.e. for breaking off the individual adapter elements, a force or breaking force must preferably be applied substantially perpendicular to the first metal layer or perpendicular to the intermediate layer, i.e. perpendicular to the main plane of extension of the arrangement. In particular, it is provided that the structuring of the first metal layer or the second metal layer determines the contours or shapes of the carrier and the adapter elements.

Furthermore, it is provided that the carrier should extend lengthwise substantially parallel to the direction, along which the adapter elements are arranged side by side in a row, and the adapter elements protrude laterally from the carrier. The adapter elements and the carrier are configured in a comb-like manner.

It is also provided that at least one electrically conductive contact extends between the carrier and the adapter element. Preferably, several, in particular two, electrically conductive contacts are provided for a single adapter element, which respectively electrically conductively connect electrically insulated parts of the first metal layer or the second metal layer to the carrier. In particular, the electrically conductive contact tears when the respective adapter element is separated from the carrier.

Preferably, it is provided that the electrically conductive contact crosses a predetermined breaking point in the arrangement, in particular a predetermined breaking point between the adapter elements and the carrier. In particular, the electrically conductive contact crosses the predetermined breaking point, preferably perpendicular. The electrically conductive contact is preferably configured in the form of a web and connects the first metal layer or the second metal layer in particular the area of the carrier with the area of the adapter element. When breaking along the predetermined breaking point, the electrically conductive contact is then broken.

Preferably, to avoid accumulation of material when breaking along a predetermined breaking point, the carrier should have a recess, particularly in the form of a groove, on a side opposite the breaking point. For example, the groove can be made with a saw, especially a "wafer saw". Alternatively or in addition, it is also conceivable that the groove is realized by laser ablation or etching. The groove is preferably located below the breaking point and extends in a lateral direction, i.e. a direction perpendicular to the longitudinal extension of the breaking point, further than a notch in the intermediate layer provided for the breaking point. The recess makes it possible to avoid the accumulation of material that would otherwise occur when breaking along the predetermined breaking point on the opposite side.

Another object of the present invention is a system comprising a laser diode, a heat sink, and an adapter element according to the invention. All features described for the adapter element according to the invention and their advantages can also be transferred to the system according to the invention and vice versa.

A further object of the present invention is a method for manufacturing an adapter element according to the invention, wherein the first metal layer and/or the second metal layer are bonded to the intermediate layer by means of a DCB process or an active soldering process. All features described for the adapter element according to the invention and their advantages can also be transferred analogously to the method of the present invention and vice versa.

A "DCB process" (Direct-Copper-Bond-Technology) is understood by the skilled person to be such a process, which is used, for example, to bond metallizations or metal sheets (e.g. copper sheets or foils) to each other and/or to ceramics or ceramic layers, using metal or copper sheets or metal or copper foils which have a layer or coating (melting layer) of a chemical compound of the metal and a reactive gas, preferably oxygen, on their surface sides. In this process, described for example in US-PS 37 44 120 or DE-PS 23 19 854, this layer or coating (melting layer) forms a eutectic with a melting temperature below the melting temperature of the metal (e.g. copper), so that by placing the film on the ceramic and heating all the layers, they can be bonded to each other by melting the metal or copper essentially only in the area of the melting layer or oxide layer.

In particular, the DCB process then has, for example, the following procedural steps:
 oxidizing a copper foil in such a way that a uniform copper oxide layer is obtained;
 arranging the copper foil on the ceramic layer;
 heating the arrangement to a process temperature between about 1065° C. to 1083° C., e.g. to about 1071° C.;
 cooling down to room temperature.

An active soldering process, e.g. for joining metallizations or metal foils, in particular also copper layers, or copper foils with ceramic material, means a process which is also specifically used for the production of metal-ceramic substrates. Here, at a temperature between approx. 650-1000° C., a connection is made between a metal foil, for example copper foil, and a ceramic substrate, for example aluminium nitride ceramic, using a brazing alloy which, in addition to a main component such as copper, silver and/or gold, also comprises an active metal. This active metal, which is for example at least one element of the group Hf, Ti, Zr, Nb, Ce, establishes a connection between the solder and the ceramic by chemical reaction, while the connection between the solder and the metal is a metallic brazing connection.

It is preferable provided that the adapter element is coated by means of a sputtering process. This makes it advantageously possible to coat the adapter element with a solder material. This solder material can then be used to connect the laser diode to the adapter element. Preferably, several adapter elements arranged in a compound are coated in a common sputter process. In particular, the sputter process is a PVD sputter deposition process.

It is advisable that the adapter element is broken off from the arrangement of adapter elements. In particular, it is provided that the adapter element is removed from the arrangement after the laser diode has been mounted on the adapter element, i.e. after coating the adapter element and mounting and soldering the laser diode onto the coated adapter element.

In particular, FIG. 1 shows a mounted adapter element 10 according to a first preferred embodiment of the present invention. Such an adapter element 10 is intended to serve as a link between a heat sink 7 and an electrical component such as a laser diode 4, the heat sink 7 being intended to cool the laser diode 4 which generates heat during operation. Here, an assembly structure is provided as adapter element 10, the adapter element 10 having in particular a first metal layer 11, which in the mounted state faces the heat sink 7, and a second metal layer 12, which in the mounted state faces the laser diode 4. Preferably, the first metal layer 11 and/or second metal layer 12 comprises copper. Between the first metal layer 11 and the second metal layer 12 there is also an intermediate layer 13, the intermediate layer 13 comprising a ceramic. In order to achieve the most homogeneous possible heat distribution in an interface region between the adapter element 10 and the heat sink 7, it is provided that the first metal layer 11 and/or the second metal layer 12 has a primary thickness P1, the primary thickness P1 being greater than 40 µm, preferably greater than 70 µm and particularly preferably greater than 100 µm. In particular, it has been shown that such thick metal layers can be realized comparatively easily and especially quickly by means of a DCB process or an active solder process.

Through such a thick metal layer, a heat spread, i. e. an expansion of an otherwise locally concentrated heat development, is possible during heat removal from the laser diode 4 via the adapter element 10. Furthermore, it is particularly preferred that the intermediate layer 13 comprising the ceramic has a secondary thickness P2 which is smaller than 400 µm, smaller than 200 µm and particularly preferred larger than 200 µm. Using such a thick intermediate layer 13, it is advantageously possible to achieve a CTE adjustment which, especially together with the heat spread, leads to a junction between the adapter element 10 and the heat sink 4 that is as free of stress as possible. This means that during operation of the laser diode 4, which is responsible for heat generation, the formation of a thermomechanical stress is suppressed or weakened by the appropriate adjustment of the primary thickness P1 and/or secondary thickness P2. This reduces the probability of crack formation or deformation of laser diode 4. To further improve conductivity, an intermediate layer 13 with a thermal conductivity of more than 150 W/mK, preferably more than 175 W/mK and especially preferably more than 225 W/mK is preferably provided.

Furthermore, it is conceivable that the primary thickness P1 of the first metal layer 11 differs from the primary thickness P1 of the second metal layer 12 or is essentially the same. It is also conceivable that a ratio between a cumulative thickness of the primary thicknesses P1 of the first metal layer 11 and the second metal layer 12 to the secondary thickness P2 has a ratio of between 0.7 and 2, preferably between 0.8 and 1.5 and particularly preferably between 0.95 and 1.2.

Furthermore, it is preferable that the intermediate layer 13 has a through hole 15. Such a through hole 15 allows the use of the adapter element 10 in applications for which a non-insulating connection of the laser diode 4 to the heat sink 7 is desired.

Figure 2:
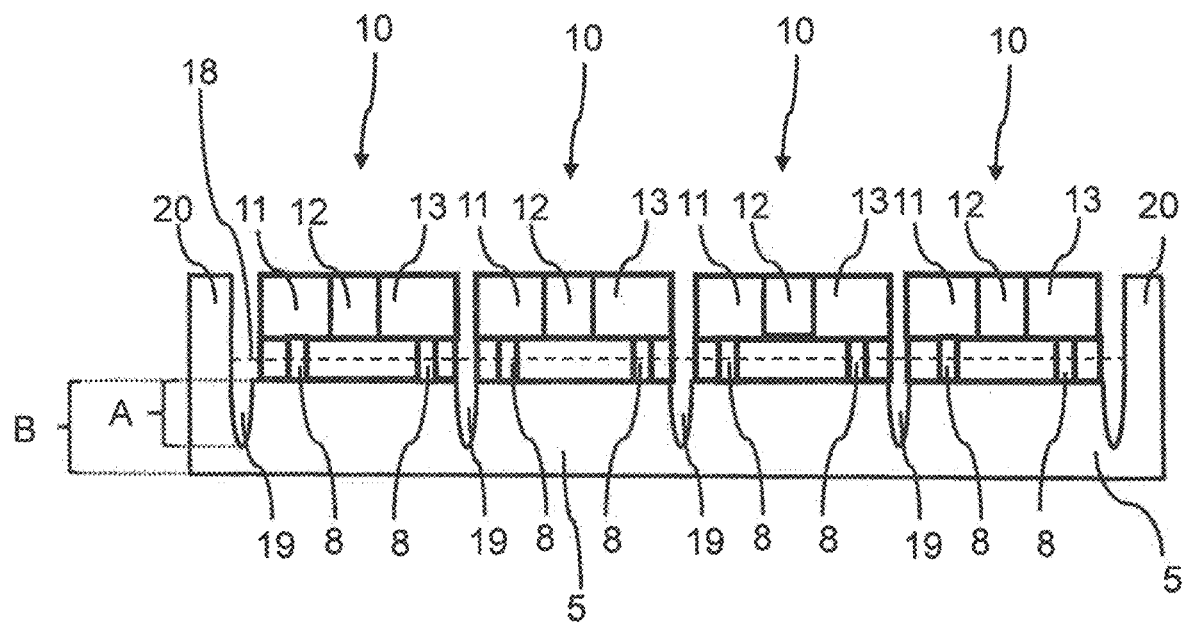
FIG. 2 shows several adapter elements according to a second preferred embodiment, the adapter elements being grouped together in an arrangement.

FIG. 2 shows several adapter elements 10 according to a second preferred embodiment, with the adapter elements 10 being grouped together in an arrangement 1. Such an arrangement 1, i. e. multiframe, is provided in particular for those who want to mount the laser diode 4 to the heat sink 7 via the adapter element 1. The formation of an arrangement 1 allows the simultaneous preparation of several adapter elements 10 for the subsequent connection process of a laser diode 4. For example, the adapter element 10 is coated by means of a sputtering process in preparation for connecting the laser diode 4 to the adapter element 10. In order to ensure the electrical contacting of the adapter elements 10 required for the sputtering process, electrically conductive contacts 8, i.e. coating contacts, are provided for each adapter element 10. In particular, these electrically conductive contacts 8 connect the respective adapter element 10 with a carrier 5 on which the adapter elements 10 are arranged. Preferably, the first metal layer and/or the second metal layer are each connected to the carrier via a conductive contact. Due to the contacts 8 already integrated in the arrangement 1, it is advantageously possible to dispense individual contacting of the individual adapter elements 10. Furthermore, it is intended that the electrically conductive contacts 8 are dimensioned in such a way that they will break off from arrangement 1 or carrier 5 when the adapter element 10 is removed. As a result, an additional production step can be dispensed with, with which the electrically conductive contact 8 would have to be removed again. Preferably, predetermined breaking points 18 are provided in the arrangement, along which the adapter elements 10 are broken off when the coating process, in particular the sputtering process, is completed and the adapter element 10 is separated from arrangement 1. Preferably, the predetermined breaking point 18 is realized by a laser treatment, e.g. by a laser scribe line in the ceramic of the intermediate layer, which crosses the electrically conductive contacts. In addition, saw gaps 19 are provided between the adapter elements 10, which extend into the carrier 5. Along this saw gap 19, the individual adapter elements 19 can be separated from each other in order to be used subsequently to connect the laser diode 4 to the heat sink 7. Preferably, the ratio of a depth A of the sawing gap 19 in the carrier 5 to the thickness B of the carrier 5 in the area of the adapter element 10 has a value between 0.6 and 0.9, preferably between 0.75 and 0.85 and especially preferably essentially 0.8. This allows easy separation of the adapter elements 10 and at the same time ensures sufficient stability to hold the adapter elements 10 together during the sputtering process. Furthermore, it is provided that the carrier 5 has a frame element 20, which is laterally connected to the sequence of adapter elements 10 lined up next to each other and is flush with the adapter elements 10 on one side. In this way, the adapter elements 10 are protected to the side by the frame elements 20.

Figure 3:
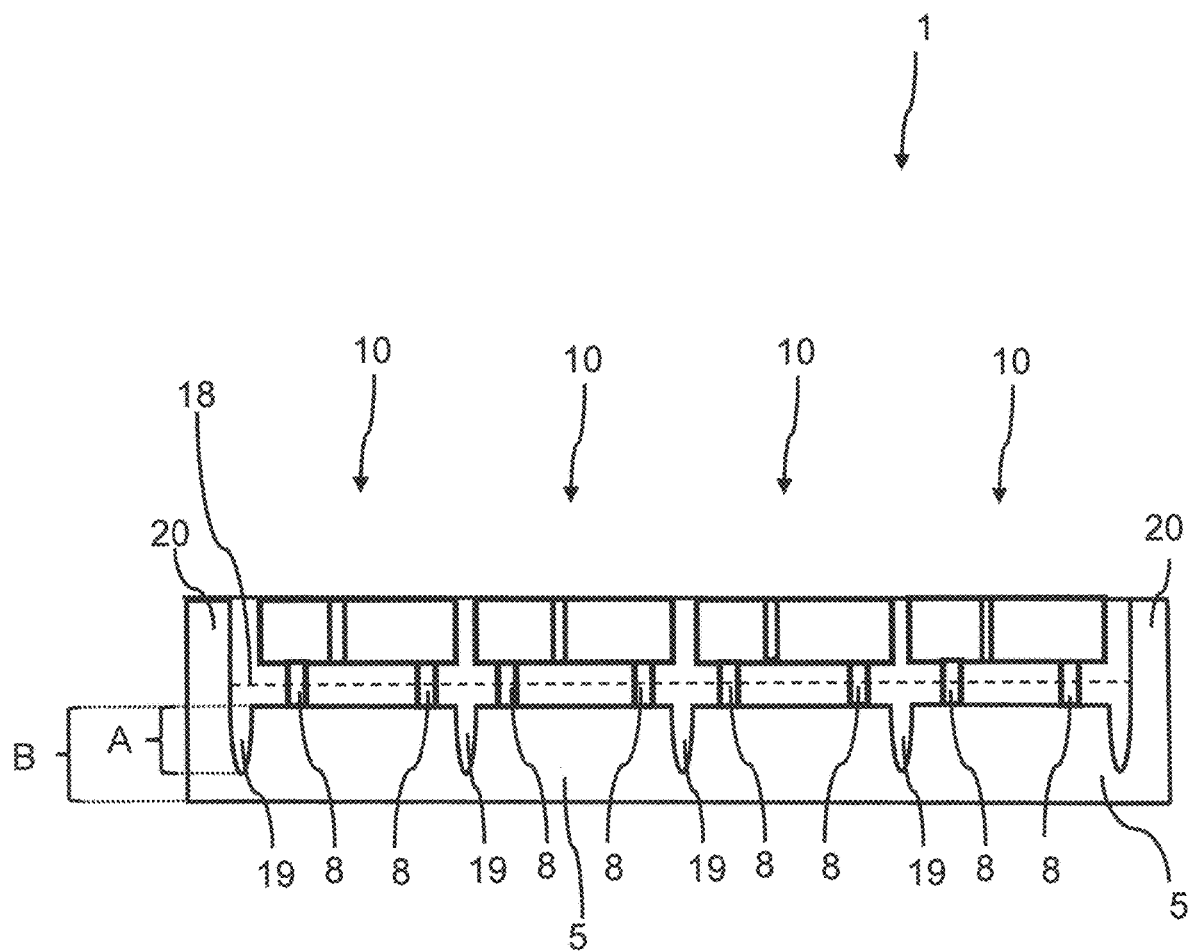
FIG. 3 shows an arrangement of several adapter elements according to an exemplary embodiment of the present invention in a top view.

FIG. 3 shows an arrangement 1 of several adapter elements 10 according to an exemplary embodiment of the present invention. In particular, this is a top view of arrangement 1, in which several adapter elements 10 are arranged next to each other along a row. In particular, the arrangement 1 is viewed along a direction parallel to a stacking direction along which the first metal layer 11, the intermediate layer 13 and the second metal layer 12 are arranged one above the other, i.e. FIG. 3 shows the structured first metal layer 11 and the second metal layer 12 respectively, the structuring of the first metal layer 11 and the second metal layer 12 determining, among other things, the assignment of the respective sections to the adapter element 10 and the carrier 5 respectively. In those areas that are exposed as a result of the structuring of the first metal layer 11 or the second metal layer 12, i.e. are without metal, the intermediate layer 13 is visible in the top view. Preferably, the predetermined breaking points 18 run along these metal-free areas, along which the adapter elements 10 can be separated from each other or from the carrier 5. Furthermore, it is provided that the adapter element 10, in particular the arrangement 1, has several electrically conductive contacts 8 which connect the carrier 5 with the adapter element 10 or different parts of the first metal layer 11 or the second metal layer 12 of the adapter element 10, in particular connecting them respectively.

Furthermore, it is preferably provided that the first metal layer 11 or the second metal layer 12 is structured on the arrangement 1 in such a way that an electrically conductive contact 8 is formed between the first metal layer 11 or the second metal layer 12 in the area of the carrier 5 and the first metal layer 11 or the second metal layer 12 in the area of the individual adapter element 10. Preferably, the electrically conductive contact 8 is formed as web. The web-shaped, electrically conductive contact 8 preferably runs perpendicular to the course of the predetermined breaking point 18, along which the adapter elements 10 are separated from the carrier 5. In particular, the electrically conductive contact 5 crosses the predetermined breaking point 18. It is also conceivable that the web-shaped, electrically conductive contact 8 is inclined at an angle of between 30° and 90°, preferably between 45° and 85° and more preferably between 60° and 80° relative to a longitudinal extension of the predetermined breaking point 18.

Furthermore, it is provided that partial areas of the first metal layer 11 or the second metal layer 12, which are electrically insulated from each other, are each connected to the carrier 5 with their own electrically conductive contact 8, in particular with the first metal layer 11 or the second metal layer 12 of the carrier 5. Furthermore, it is provided that along a direction determined by the longitudinal extension of the predetermined breaking point 18 between the adapter elements 10 and the carrier 5, a width of the web-like electrically conductive contact 8 is narrower than 0.1 times, preferably less than 0.05 times and more preferably less than 0.01 times the width of the adapter element 10 dimensioned in the same direction.

Figure 4:
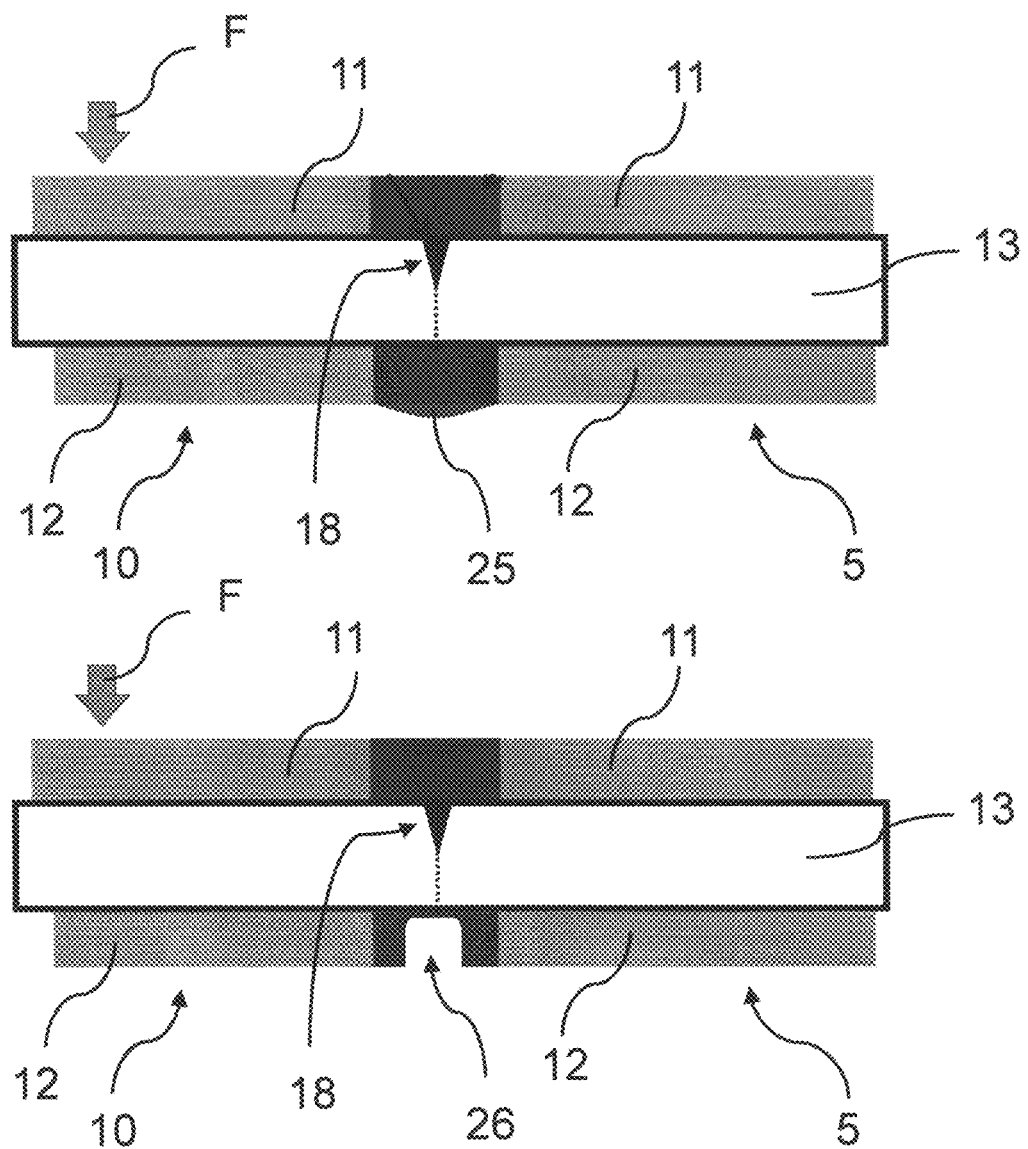
FIG. 4 shows two arrangements of several adapter elements according to another exemplary embodiment of the present invention in side views.

FIG. 4 shows two sectional views through the arrangement 1 of FIG. 3. In particular, the top sectional view shows an arrangement 1 before the adapter elements 10 are separated. When breaking off, a force F is applied to the arrangement 1. As a result of the breaking, the opposite side of arrangement 1 to the side subjected to the force experiences an accumulation of material below the predetermined breaking point 18. This accumulation of material forms a bead-like projection 25 on the outside of arrangement 1. In order to counteract such an undesired accumulation of material with a corresponding protrusion, it is preferably provided that a groove 26 is inserted into arrangement 1 on the side opposite the predetermined breaking point 18, for example by means of a saw, in particular a "wafer saw", by etching or by means of a machining process, in particular milling. In particular, the groove 25 runs below the predetermined breaking point 18 as seen in the stacking direction, the predetermined breaking point being more preferably embedded in the intermediate layer 13 in a wedge shape. Preferably, a lateral extension of the groove 26 is wider than a lateral extension of the gap serving as a predetermined breaking point 18.

REFERENCE SIGNS

1 arrangement
4 laser diode
5 carrier
7 heat sink
8 contact
10 adapter element
11 first metal layer
12 second metal layer
13 intermediate layer
15 via
18 predetermined breaking point
19 saw gap
20 frame element
25 protrusion
26 groove
A depth
B thickness
F force

The invention claimed is:

1. An arrangement (1) of several adapter elements (10) for connecting a component (4) to a heat sink (7), comprising
a first metal layer (11), which in a mounted state faces the component (4), and a second metal layer (12), which in the mounted state faces the heat sink (7), and
an intermediate layer (13) comprising ceramic arranged between the first metal layer (11) and the second metal layer (12),
wherein the first metal layer (11) and/or the second metal layer (12) is thicker than 40 µm,
the adapter elements being separable from a carrier (5) by a predetermined breaking point characterized in that the adapter element (1) or the adapter elements (10) have an electrically conductive contact (8) to the carrier (5) of the arrangement (1) characterized in that the electrically conductive contact (8) extends between the carrier (5) and the adapter element (10).

2. The arrangement (1) according to claim 1, wherein for adapting the expansion coefficients, the intermediate layer (13) is thinner than 400 µm.

3. The arrangement (1) according to claim 1, wherein a ratio between a cumulative thickness of a primary layer thickness of the first metal layer (11) and a primary layer thickness of the second metal layer (12) to a secondary layer thickness of the intermediate layer (13) has a value between 0.2 and 0.8.

4. The arrangement (1) according to claim 1, wherein the electrically conductive contact (8) is configured to break off when the predetermined breaking point is broken.

5. The arrangement (1) according to claim 1, wherein the intermediate layer (13) has an electrically conductive through-hole (15).

6. The arrangement (1) according to claim 1, wherein the electrically conductive contact (8) crosses the predetermined breaking point (18).

7. The arrangement (1) according to claim 1, wherein the carrier (5) has a recess configured to avoid an accumulation of material when breaking along a predetermined breaking point (18).

8. The arrangement (1) according to claim 1, wherein
the first metal layer (11) and/or the second metal layer (12) is thicker than 70 µm,
the intermediate layer (13) is thinner than 200 µm, and
a ratio between a cumulative thickness of a primary layer thickness of the first metal layer (11) and a primary layer thickness of the second metal layer (12) to a secondary layer thickness of the intermediate layer (13) has a between 0.25 and 0.65.

9. The method according to claim 8, wherein the adapter element (10) is broken off from the arrangement (1) of adapter elements (10).

10. The arrangement (1) according to claim 1, wherein
the first metal layer (11) and/or the second metal layer (12) is thicker than 100 µm,
the intermediate layer (13) is thinner than 100 µm, and
a ratio between a cumulative thickness of a primary layer thickness of the first metal layer (11) and a primary layer thickness of the second metal layer (12) to a secondary layer thickness of the intermediate layer (13) has a value between 0.3 and 0.55.

11. The method according to claim 10, wherein the adapter element (10) is coated by a sputtering process.

12. The arrangement (1) according to claim 1, wherein the electrically conductive contact (8) crosses a predetermined breaking point (18) between the adapter elements (10) and the carrier (5).

13. The arrangement (1) according to claim 1, wherein, in order to avoid an accumulation of material, when breaking along a predetermined breaking point (18), the carrier (5) has a recess in a form of a groove (26), on a side opposite the predetermined breaking point (18).

14. A method for producing an arrangement (1) according to claim 1, wherein the first metal layer (11) and/or the second metal layer (12) are bonded to the intermediate layer (13) by means of a DCB method or an active soldering method.

\* \* \* \* \*